United States Patent
Asanuma

(10) Patent No.: US 12,303,982 B2
(45) Date of Patent: May 20, 2025

(54) SURFACE-COATED CUTTING TOOL

(71) Applicant: MITSUBISHI MATERIALS CORPORATION, Tokyo (JP)

(72) Inventor: Hidetoshi Asanuma, Tokyo (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 879 days.

(21) Appl. No.: 17/427,128

(22) PCT Filed: Feb. 6, 2020

(86) PCT No.: PCT/JP2020/004465
§ 371 (c)(1),
(2) Date: Jul. 30, 2021

(87) PCT Pub. No.: WO2020/166466
PCT Pub. Date: Aug. 20, 2020

(65) Prior Publication Data
US 2022/0143712 A1 May 12, 2022

(30) Foreign Application Priority Data

Feb. 12, 2019 (JP) .................. 2019-022629
Feb. 12, 2019 (JP) .................. 2019-022630

(51) Int. Cl.
*B23B 27/14* (2006.01)
*C01B 21/06* (2006.01)
*C23C 14/06* (2006.01)

(52) U.S. Cl.
CPC ........ *B23B 27/148* (2013.01); *C01B 21/0602* (2013.01); *C23C 14/0641* (2013.01); *B23B 2228/10* (2013.01); *C01P 2002/50* (2013.01)

(58) Field of Classification Search
None
See application file for complete search history.

(56) References Cited

U.S. PATENT DOCUMENTS

2008/0299366 A1  12/2008  Ahlgren et al.
2014/0013914 A1   1/2014  Senbokuya et al.
(Continued)

FOREIGN PATENT DOCUMENTS

EP   2669031 A1  12/2013
EP   3342512 A1   7/2018
(Continued)

OTHER PUBLICATIONS

Supplementary European Search Report dated May 31, 2022, issued for European Patent Application No. 20756574.8.

*Primary Examiner* — Shawn Mckinnon
(74) *Attorney, Agent, or Firm* — Troutman Pepper Locke LLP; James E. Armstrong, IV; Nicholas J. DiCeglie, Jr.

(57) ABSTRACT

A surface-coated cutting tool comprises a hard coat layer including a complex nitride layer on the tool substrate. The complex nitride layer has a composition: $(Me_{1-x-y}Al_xM_y)N_z$ where Me is Ti or Cr, $x \leq 0.80$, $0.00 \leq y \leq 0.20$, $0.20 \leq (1-x-y) \leq 0.65$, and $0.90 \leq z \leq 1.10$ (where x, y, and z represents atomic ratios, M is at least one element selected from the group consisting of Groups 4 to 6 elements, Y, Si, La, and Ce in the IUPAC periodic table). The hard coat layer has an interfacial region extending from a point above the surface of the tool substrate and having a thickness in a range of 5 to 100 nm, and the N content to the total of Me, Al, M, and N contents is 10 to 30 atomic % at the point and increases toward the surface of the cutting tool.

18 Claims, 1 Drawing Sheet

(56) References Cited

U.S. PATENT DOCUMENTS

| | | | |
|---|---|---|---|
| 2016/0175939 A1* | 6/2016 | Tanaka | C23C 28/42 428/216 |
| 2019/0022763 A1 | 1/2019 | Tanaka et al. | |
| 2019/0040519 A1 | 2/2019 | Sato et al. | |
| 2019/0076933 A1 | 3/2019 | Nishizawa | |

FOREIGN PATENT DOCUMENTS

| EP | 3437771 A1 | 2/2019 |
|---|---|---|
| GB | 2135337 A | 8/1984 |
| JP | S59-159983 A | 9/1984 |
| JP | H06-322517 A | 11/1994 |
| JP | H10-237629 A | 9/1998 |
| JP | 2009-119551 A | 6/2009 |
| JP | 2011-240435 A | 12/2011 |
| JP | 5617933 B2 | 11/2014 |
| JP | 2017-164859 A | 9/2017 |
| JP | 2017-177237 A | 10/2017 |
| WO | 2015/186503 A1 | 12/2015 |
| WO | 2018/105403 A1 | 6/2018 |

\* cited by examiner

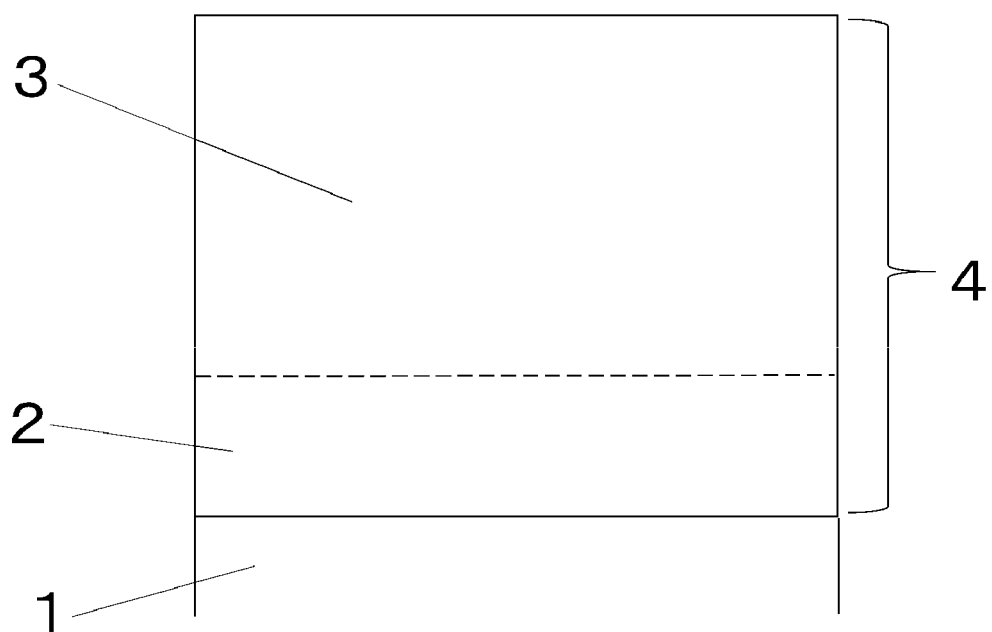

SURFACE-COATED CUTTING TOOL

CROSS REFERENCE TO RELATED APPLICATIONS

This application is a U.S. National Stage Application under 35 U.S.C. § 371 of International Application No. PCT/JP2020/004465, filed Feb. 6, 2020, which claims priority from Japanese Patent Application No. 2019-022629, filed Feb. 12, 2019 and Japanese Patent Application No. 2019-022630, filed Feb. 12, 2019. Each of the above applications is hereby expressly incorporated by reference, in its entirety, into the present application.

TECHNICAL FIELD

The present invention relates to a surface-coated cutting tool (hereinafter, also referred to as "coated tool" in some cases).

BACKGROUND ART

Generally known examples of coated tools include inserts that are detachably mounted to turning tools for turning and plaining of work materials, such as various steels, e.g., carbon steel and alloy steel, and cast iron; drills and miniature drills used for drilling of work materials; solid end mills used for facing, grooving, and shouldering; and inserted end mills provided with detachable inserts for cutting like solid end mills.

Coated tools have also been known that include tool substrates made of tungsten carbide (WC) cemented carbide alloys, titanium carbonitride (TiCN) thermets, and cubic boron nitride (cBN) sinters and hard coat layers thereon. A variety of measures have been proposed for improvements in cutting performance of coated tools.

For example, Patent Literature 1 discloses a hard-layer coated tool that includes a tool substrate provided with a bottom layer, an intermediate layer, and a top layer thereon; wherein (a) the bottom layer comprises at least one metal element selected from the group consisting of groups IV, V and VI elements, Al, and Si; and at least one non-metal elements selected from the group consisting of N, C, and B;

(b) the upper layer comprises $(Al_xCr_y)_cO_d$ (where x=0.1 to 0.40, x+y=1, c=1.86 to 2.14, and d=2.79 to 3.21) having an a crystal structure wherein the equivalent x-ray diffraction intensity ratio TC(110) is 1.3 or more, TC(110) is greater than TC(104), and TC(006) is 0; and (c) the intermediate layer comprises oxynitride of metal elements comprising Al and Cr as essential elements and has a gradient composition wherein the oxygen level increases from the bottom-layer side to the top-layer side while the nitrogen level decreases from the bottom-layer side to the top-layer side, the average composition $(Al_sCr_t)_a(N_vO_w)_b$ satisfies the following conditions s=0.1 to 0.6, s+t=1, v=0.1 to 0.8, v+w=1, a=0.35 to 0.6, and a+b=1.

Patent Literature 2 discloses a cutting tool including a tool substrate and an ultramultiple hard coat layer comprising a first TiAl nitride layer and a second TiAl nitride layer disposed in sequence on the surface of the tool substrate, wherein (1) the first TiAl nitride layer satisfies conditions $0<\alpha/\beta\leq3$ and $0.2\leq(\alpha+\beta)/\gamma\leq2$ where Ti:Al:N=$\alpha$:$\beta$:$\gamma$;

(2) the second TiAl nitride layer satisfies the conditions $0<\alpha/\beta3$, $T=(\alpha+\beta)/\gamma$, and $2\geq T_1>T_2>T_3>T_4>\ldots>T_n\geq0.1$ where $T_n$ is continuously or discontinuously $T_1$ $T_2$ $T_3$ $T_4$ $\ldots$ $T_n$ (n is any integer) from the substrate side to the surface side.

Patent Literature 3 discloses a wear resistant substrate and an amorphous hard layer disposed thereon. The amorphous hard layer is prepared from a deposition source having a composition $Al_aM_b$ (M is at least one element selected from the group consisting of Ti, Ta, V, Cr, Zr, Nb, Mo, Hf, W, Fe, Co, Ni, Cu, and Mn where 60 at %≤a≤98.5 at % and 1.5 at %≤b≤40 at %), the partial pressure of a reactive gas containing nitrogen, oxygen, or carbon supplied is controlled to vary continuously or stepwise such that the content of the reactive gas component in the amorphous hard layer increases toward the surface of the layer. Such a hard layer is applicable to electric and electronic materials, high-strength materials, high-abrasion materials, and heat resistant materials.

Patent Literature 4 discloses a composite comprising a substrate and a wear-resistant surface layer including an inner and outer coating layers thereon, the coating layers having a composition MeNx, wherein the inner coating layer satisfies 0.5<x<0.9 and the outer coating layer satisfies 0.9<x≤1.0, and Me is a metal belonging to any one of Groups III to IV in the periodic table. Such a composite is applicable to cutting tools.

CITATION LIST

Patent Literature

[PTL 1] Japanese Patent No. 5617933
[PTL 2] Japanese Unexamined Patent Application Publication No. H10-237629
[PTL 3] Japanese Unexamined Patent Application Publication No. H6-322517
[PTL 4] Japanese Unexamined Patent Application Publication No. S59-159983

SUMMARY OF INVENTION

Technical Problem

Since the cutting edge is heated to high temperature during high-rate cutting of carbon steel, alloy steel, stainless steel, and cast iron, the hard coat layers (wear resistant layers) of the coated tools disclosed in Patent Literatures 1 to 4 undergo rapid changes in their compositions to yield fragile hard coat layers within short times, resulting in short service lives with unsuccessful cutting performance. Throughout the specification, it is noted that high-rate cutting refers to a cutting rate that is at least 15% higher than an ordinal cutting rate for stainless steel producing much heat or at least 30% higher than a conventional cutting rate for carbon steel, alloy steel, and cast iron.

An object of the present invention is to provide a cutting tool including a hard coat layer that exhibits high chipping resistance and satisfactory cutting performance for a long period of use even during high-rate cutting of carbon steel, alloy steel, stainless steel, and cast iron.

Solving Means

The surface-coated cutting tool in accordance with one embodiment of the present invention is characterized by the following features (1) and (2):

(1) The cutting tool includes a tool substrate and a hard coat layer including a complex nitride layer on the tool substrate;

the complex nitride layer has a composition: $(Ti_{1-x-y}Al_xM_y)N_z$ where $0.35 \leq x \leq 0.80$, $0.00 \leq y \leq 0.20$, $0.20 \leq (1-x-y) \leq 0.65$, and $0.90 \leq z \leq 1.10$ (where x, y, and z represents atomic ratios, M is at least one element selected from the group consisting of Groups 4 to 6 elements, Y, Si, La, and Ce in the IUPAC periodic table), the hard coat layer has an interfacial region extending from a point above the surface of the tool substrate toward the surface of the cutting tool and having a thickness in a range of 5 to 100 nm, and the N content ratio to the total of Ti, Al, M, and N contents is 10 to 30 atomic % at the point and increases toward the surface of the cutting tool.

(2) The cutting tool includes a tool substrate and a hard coat layer including a complex nitride layer on the tool substrate tool substrate;

the complex nitride layer has a composition: $(Cr_{1-x-y}Al_xM_y)N_z$ where $0.35 \leq x \leq 0.80$, $0.00 \leq y \leq 0.20$, $0.20 \leq (1-x-y) \leq 0.65$, and $0.90 \leq z \leq 1.10$ (where x, y, and z represents atomic ratios, M is at least one element selected from the group consisting of Groups 4 to 6 elements, Y, Si, La, and Ce in the IUPAC periodic table), the hard coat layer has an interfacial region extending from a point above the surface of the tool substrate toward the surface of the cutting tool and having a thickness in a range of 5 to 100 nm, and the N content ratio to the total of Cr, Al, M, and N contents is 10 to 30 atomic % at the point and increases toward the surface of the cutting tool.

Advantageous Effect

The surface-coated cutting tool, which comprises a hard coat layer including a complex nitride layer containing Al, Ti, and M, is suitable for high-rate cutting of alloy steel and cast iron. The surface-coated cutting tool, which comprises a hard coat layer including a complex nitride layer containing Al, Cr, and M, is suitable for high-rate cutting of carbon steel and stainless steel. These cutting tools including the hard coat layers exhibit high chipping resistance that ensures satisfactory cutting performance over long terms of use.

BRIEF DESCRIPTION OF DRAWING

FIG. 1 is a longitudinal sectional view of a hard coat layer of a surface-coated cutting tool in accordance with an embodiment of the present invention.

EMBODIMENT OF INVENTION

The present inventor has extensively investigated physical properties of hard coat layers each including a complex nitride layer containing Al, Ti, and M, or Al, Cr, and M (where M is at least one element selected from the group consisting of Groups 4 to 6 elements in the IUPAC periodic table, Y, Si, La, and Ce, —(hereinafter referred to as a (TiAlM)N layer or a (CrAlM)N layer in some cases) and has discovered the following facts.

(1) A hard coat layer including a (TiAlM)N or (CrAlM)N layer having a low N content exhibits high wear resistance even during high-rate cutting, probably due to high thermal stability of the layer.

(2) A variable N content increasing from a point above the surface of the tool substrate toward the surface of the cutting tool in the interfacial region (a predetermined range of the hard coat layer in the vicinity of the surface of the tool substrate) to the tool substrate improves the cutting performance for the following reason: an increasing N content precludes decomposition of the hard coat layer and thus reduces cracking in the vicinity of the interface, resulting in high adhesion of the hard coat layer.

Although Patent Literatures 1 to 4 mention layers having variable N contents, but they do not mention or suggest the fact (1) or (2).

The coated tool in accordance with a first embodiment of the present invention will now be described in detail. The numerical range "A to B" in the specification and claims shall include the lower limit (A) and the upper limit (B). The lower limit (A) and the upper limit (B) have the same unit of measure. All the numerical values have a tolerance of measurement.

Hard Coat Layer:

With reference to FIG. 1, the hard coat layer 4 of the coated tool in accordance with the embodiment is formed on the tool substrate 1 and has a hard coat film (main region) 3 and an interfacial region 2 with a predetermined thickness. The hard coat layer 4 is a (TiAlM) N or (CrAlM) N layer.

Preferably the hard coat layer has an average thickness in the range of 0.5 to 10.0 μm. An average thickness below 0.5 μm does not establish desirable wear resistance for long term use, whereas an average thickness above 10.0 μm tends to form coarse crystal grains that preclude an improvement in chipping resistance.

(TiAlM)N Layer and (CrAlM)N Layer:

The (TiAlM)N hardcoat layer of the coated tool has an average composition represented by formula $(Ti_{1-x-y}Al_xM_y)N_z$ and the (CrAlM)N layer has an average composition represented by formula $(Cr_{1-x-y}Al_xM_y)N_z$, where $0.35 \leq x \leq 0.80$, $0.00 \leq y \leq 0.20$, $0.20 \leq (1-x-y) \leq 0.65$, and $0.90 \leq z \leq 1.10$ (where x, y, and z each represent atomic ratio, and M is at least one element selected from the group consisting of Groups 4 to 6 elements in the IUPAC periodic table, Y, Si, La, and Ce).

The ranges of parameters x, y, 1−x−y, and z are determined by the following reasons:

An x value below 0.35 fails to high hardness and leads to formation of coarse crystal grains. An x value above 0.80 leads to partial transformation from a face-centered structure of a NaCl type to a hexagonal crystal structure, resulting in low hardness. More preferred range is $0.45 \leq x \leq 0.70$.

An average y content above 0.20 of the optional component M leads to low toughness that readily causes chipping and cracking.

A (1−x−y) value below 0.20 leads to low toughness that readily causes chipping and cracking due to a decrease in relative Ti or Cr content. A (1−x−y) value above 0.65 does not lead to high hardness.

A z value of 0.90 or more leads to improved heat resistance and high wear resistance. A z value above 1.10 leads to extraordinarily high residual stress in the hard coat layer, resulting in low cracking resistance.

The average composition and the average thickness of the (TiAlM)N layer and the (CrAlM)N layer can be determined by cross-sectional observation (observation of a cross-section perpendicular to the surface of the tool substrate) of the tool by scanning electron microscopy (SEM), transmission electron microscopy (TEM), or energy dispersive X-ray spectroscopy (EDS).

Interfacial Region of Hard Coat Layer:

In the coated tool in accordance with this embodiment, there is an interfacial region of the hard coat layer with an average thickness in the range of 5 to 100 nm (thickness) above the surface of the tool substrate and toward the surface of the tool. In this interfacial region, the N content ratio to the total of Ti, Al, M, and N content, and the N content ratio to the total of Cr, Al, M, and N content are both 10 to 30 atomic percent on the surface side of the tool substrate (i.e. a point at which atoms (Ti, Al, M, N) and (Cr, Al, M, N) in the film composition are detected in the interfacial region from the surface side of the tool base to the tool surface side).

In such preferred ranges, the (TiAlM)N layer and the (CrAlM)N layer in the interfacial region on the tool substrate barely undergo changes in compositions (degradation), which reduces cracking in or near the interfacial region and improves adhesion between the tool substrate and the hard coat layer, resulting in improved cutting performance. The average thickness of the interfacial region more preferably ranges from 20 to 80 nm. The N content in the interfacial region can be determined by TEM-EDS.

Tool Substrate:

Any known tool substrate can be used in the present invention within a scope that complies with the object of the invention. Examples of preferable materials for the too substrate include cemented carbide alloys (WC cemented carbide alloys including, for example, Co in addition to WC, and carbonitrides of Ti, Ta, and Nb); thermets (primary composed of TiC, TiN, or TiCN); high-speed steel, ceramics such as titanium carbide, silicon carbide, silicon nitride, aluminum nitride, and aluminum oxide); cBN sinter; and diamond sinters.

Production of (TiAlM)N Layer and (CrAlM)N Layer:

The (TiAlM)N layer and (CrAlM)N layer of the coated tool in accordance with this embodiment can be produced with an arc ion plating (AIP) system, which belongs to PVD systems. The interfacial region extending from a point above the surface of the tool substrate toward the surface of the coated tool and having an average thickness of 5 to 100 nm is formed while the partial pressure of gaseous nitrogen, which is one of the atmospheric gases, is gradually increased, for example, linearly increased from the start of deposition of the layer.

Examples

Examples of the coated tool will now be described. These examples should not be construed to limit the scope of the present invention. Although the following description is focused on application of insert cutting tools including tool substrates composed of WC cemented alloys, the examples can also be applied to tool substrates composed of TiCN thermets and use of drills and end mills as the coated tools.

Powdered cobalt (Co), vanadium carbide (VC), chromium carbide ($Cr_3C_2$), titanium carbide (TiC), tantalum carbide (TaC), niobium carbide (NbC), and tungsten carbide (WC) were compounded into formulations shown in Table 1. After addition of wax, each powder mixture was wet-mixed for 72 hours in a ball mill, and was dried under reduced pressure. The dried mixture was compacted under a pressure of 100 MPa with a press machine. The resulting green compact is sintered and is shaped into predetermined dimensions to yield Tool substrates 1 to 3 made of WC cemented carbide alloys having an insert shape in accordance with ISO SEEN1203AFTN1.

Hard coat layers were formed on Tool substrates 1 to 3 with an AIP system as follows: Tool substrates 1 to 3 were cleaned by ultrasonic waves in acetone and were then dried. These substrates were mounted at different positions on a turntable provided in the AIP system. These positions were at a predetermined distance from the center of the turntable. Cathodes (evaporation sources) were a Ti—Al-M alloy target and a Cr—Al-M alloy target, each having a composition corresponding to the average composition of the (TiAlM)N layer or the (CrAlM)N layer.

The AIP system was heated to 500° C. with a heater under a vacuum pressure of $10^{-2}$ Pa or less. A DC bias voltage of 200 to -1000 V was then applied to tool substrates which revolve while autorotating on a revolving turntable in an argon atmosphere of 0.5 to 2.0 Pa. The tool substrates were thereby subjected to bombard treatment for 5 to 120 minutes by argon or metal ions where a DC current of 80 to 240 A was applied between the cathode (evaporation source) and the anode to generate metal ions by arc discharge.

Reactive gases, i.e., nitrogen gas and argon gas with a partial pressure 0.1 to 5.0 Pa shown in Tables 2 and 3 were introduced for a given time into the AIP system. The tool substrates which revolve while autorotating on the revolving turntable were supplied with a given DC bias voltage within -30 to -150 V as shown in Tables 2 and 3 at a furnace temperature shown in Tables 2 and 3 while a DC voltage within 80 to 240 A as shown in Tables 2 and 3 was applied between the cathode (evaporation source) composed of the Ti—Al-M or Cr—Al-M alloy target and the anode to generate arc discharge. Coated tools 1 to 9 and 11 to 19 (10 was vacant) of the present invention (hereinafter referred to as "Example tools") were thereby prepared as shown in Tables 4 and 5.

The term "$N_2$ gas supply time in interfacial region (min) in Tables 2 and 3 refers to "supply time (min) of $N_2$ gas during formation of the interfacial region". The pressure of the mixed gas, and the $N_2$ and Ar volume % were linearly varied from the initial state to the final state by spending the "gas supply time in the interfacial region (min)", and the values at the final stage were kept to the completion of the deposition.

For comparison, a (TiAlM)N layer was formed under the conditions shown in Table 2 or a (CrAlM)N layer was formed under the conditions shown in Table 3 onto each of tool substrates 1 to 3 by deposition in the AIP system. Coated cutting tools 1 to 3 and 11 to 13 (4 to 10 were vacant) for comparison (hereinafter, "Comparative Example tools) were produced as shown in Tables 6 and 7.

The average thickness and the average composition of the (TiAlM)N or (CrAlM)N hard coat layer, and the N content of the interfacial region were determined by cross-sectional observation (observation of a cross-section perpendicular to the surface) of the tool substrate by scanning electron microscopy (SEM), transmission electron microscopy (TEM), or energy dispersive X-ray spectroscopy (EDS). The rectangular cross-sectional area for observation was determined as follows: The longitudinal length includes the upper portion of the tool substrate, the entire interfacial layer, and the entire hard coat layer whereas the lateral length, which is parallel to the surface of the tool substrate, is 10 μm.

In detail, thicknesses of five points were measured in a cross-sectional image at a magnification of 5000, and their average is defined as an average thickness. The average composition and the N content of the interfacial region were determined by EDS line analysis of five lines equally separated at an equal interval of 100 μm across the thickness of the layer.

The start position on the tool base side was 0.5 nm shifted toward the tool surface from the point closest to the surface of the tool substrate where the constituent atoms of the hard (Ti, Al, M, N) or (Cr, Al, M, N) film layer were detected and the N content ranged from 10 to 30 atomic percent. The end position on the tool surface side was 0.5 nm further shifted toward the tool substrate side from the point where the N content did not increase any further. The start and end positions were determined with reference to the surface of the tool substrate. In each of Tables 4 to 7, the N contents at the start position on the tool substrate side and at the end position on the tool surface side are the average values of the five analytical results mentioned above. The average thickness of the interface region corresponds to the sum of the distance between the start and end positions on this tool substrate side and this tool surface side and 1 nm.

TABLE 1

| Tool | Composition (mass %) | | | | | | |
|---|---|---|---|---|---|---|---|
| substrate | Co | TiC | VC | TaC | NbC | $Cr_3C_2$ | WC |
| 1 | 7.0 | — | 1.5 | — | 1.5 | — | balance |
| 2 | 12.0 | — | 2.0 | — | — | 0.5 | balance |
| 3 | 10.0 | 1.0 | — | 1.5 | 0.5 | — | balance |

A "—" indicates that the element was not contained.

TABLE 2

Deposition condition of (TiAlM)N layer

| | | | Initial | | | Final | | Gas supply time in interfacial | DC bias | Arc | Furness |
|---|---|---|---|---|---|---|---|---|---|---|---|
| Type | | Tool substrate | Pressure (Pa) | $N_2$ (Volume %) | Ar (Volume %) | Pressure (Pa) | $N_2$ (Volume %) | Ar (Volume %) | region (min) | voltage (−V) | current (A) | temp. (° C.) |
| Example tool | 1 | 1 | 0.1 | 50.0 | 50.0 | 3.0 | 100.0 | 0.0 | 2.1 | 85 | 150 | 700 |
| | 2 | 2 | 0.5 | 20.0 | 80.0 | 1.0 | 100.0 | 0.0 | 5.3 | 30 | 240 | 450 |
| | 3 | 3 | 0.3 | 50.0 | 50.0 | 2.5 | 100.0 | 0.0 | 1.0 | 150 | 80 | 550 |
| | 4 | 1 | 1.0 | 25.0 | 75.0 | 1.5 | 100.0 | 0.0 | 8.0 | 100 | 200 | 400 |
| | 5 | 2 | 0.2 | 100.0 | 0.0 | 5.0 | 100.0 | 0.0 | 5.3 | 75 | 150 | 450 |
| | 6 | 3 | 0.4 | 75.0 | 25.0 | 2.0 | 100.0 | 0.0 | 4.8 | 70 | 200 | 400 |
| | 7 | 1 | 0.1 | 100.0 | 0.0 | 2.5 | 100.0 | 0.0 | 8.0 | 120 | 200 | 650 |
| | 8 | 2 | 0.3 | 66.7 | 33.3 | 3.0 | 100.0 | 0.0 | 8.0 | 50 | 180 | 500 |
| | 9 | 3 | 0.5 | 80.0 | 20.0 | 3.0 | 100.0 | 0.0 | 5.1 | 45 | 220 | 700 |
| Comparative example tool | 1 | 1 | 3.0 | 0.0 | 100.0 | 3.0 | 100.0 | 0.0 | 0.0 | 40 | 240 | 450 |
| | 2 | 2 | 5.0 | 0.0 | 100.0 | 5.0 | 100.0 | 0.0 | 0.0 | 50 | 120 | 500 |
| | 3 | 3 | 3.0 | 0.0 | 100.0 | 5.0 | 100.0 | 0.0 | 0.0 | 100 | 80 | 600 |

Deposition was continued under the final nitrogen partial pressure to deposit a main region of the hard coat layer, throughout the entire deposition process. The furnace temperature, DC bias voltage, and arc current were kept constant.

TABLE 3

Deposition condition of (CrAlM)N layer

| | | | Initial | | | Final | | Gas supply time in interfacial | DC bias | Arc | Furness |
|---|---|---|---|---|---|---|---|---|---|---|---|
| Type | | Tool substrate | Pressure (Pa) | $N_2$ (Volume %) | Ar (Volume %) | Pressure (Pa) | $N_2$ (Volume %) | Ar (Volume %) | region (min) | voltage (−V) | current (A) | temp. (° C.) |
| Example tool | 11 | 1 | 0.3 | 66.7 | 33.3 | 2.5 | 100.0 | 0.0 | 1.0 | 120 | 80 | 570 |
| | 12 | 2 | 0.1 | 80.0 | 20.0 | 1.5 | 100.0 | 0.0 | 6.4 | 150 | 200 | 500 |
| | 13 | 3 | 0.5 | 30.0 | 70.0 | 2.0 | 100.0 | 0.0 | 2.7 | 30 | 240 | 750 |

TABLE 3-continued

| | | Deposition condition of (CrAlM)N layer | | | | | | | | |
|---|---|---|---|---|---|---|---|---|---|---|
| | | Initial | | | Final | | | Gas supply time in interfacial | DC bias | Arc | Furness |
| Type | Tool substrate | Pressure (Pa) | N$_2$ (Volume %) | Ar (Volume %) | Pressure (Pa) | N$_2$ (Volume %) | Ar (Volume %) | region (min) | voltage (−V) | current (A) | temp. (° C.) |
| | 14 | 1 | 0.2 | 75.0 | 25.0 | 5.0 | 100.0 | 0.0 | 5.3 | 150 | 150 | 450 |
| | 15 | 2 | 1.0 | 30.0 | 70.0 | 4.0 | 100.0 | 0.0 | 5.3 | 70 | 180 | 500 |
| | 16 | 3 | 0.5 | 40.0 | 60.0 | 1.0 | 100.0 | 0.0 | 6.7 | 85 | 240 | 550 |
| | 17 | 1 | 0.4 | 50.0 | 50.0 | 3.5 | 100.0 | 0.0 | 1.3 | 100 | 180 | 450 |
| | 18 | 2 | 0.2 | 75.0 | 25.0 | 3.5 | 100.0 | 0.0 | 3.2 | 50 | 150 | 500 |
| | 19 | 3 | 0.4 | 75.0 | 25.0 | 4.0 | 100.0 | 0.0 | 7.2 | 55 | 100 | 650 |
| Comparative | 11 | 1 | 2.0 | 0.0 | 100.0 | 2.0 | 100.0 | 0.0 | 0.0 | 55 | 150 | 750 |
| example | 12 | 2 | 1.0 | 0.0 | 100.0 | 1.0 | 100.0 | 0.0 | 0.0 | 70 | 180 | 500 |
| tool | 13 | 3 | 3.0 | 0.0 | 100.0 | 3.0 | 100.0 | 0.0 | 0.0 | 120 | 200 | 450 |

Deposition was continued under the final nitrogen partial pressure to deposit a main region of the hard coat layer, throughout the entire deposition process. The furnace temperature, DC bias voltage, and arc current were kept constant.

TABLE 4

| | | (TiAlM)N layer | | | | | Interfacial region | | | | |
|---|---|---|---|---|---|---|---|---|---|---|---|
| Type | | Tool substrate | Average Al content x (atomic ratio) | Type of M (—: none) | Average M content y (atomic ratio) | Average N content z (atomic ratio) | Average thickness (μm) | Tool substrate side | N content at tool substrate side (atomic %) | Tool surface side | N content at tool surface side (atomic %) | Average thickness (nm) |
| Example tool | 1 | 1 | 0.35 | Si | 0.20 | 0.90 | 0.5 | 1 | 10 | 20 | 45 | 20 |
| | 2 | 2 | 0.60 | Ce | 0.02 | 1.00 | 2.0 | 1 | 12 | 80 | 50 | 80 |
| | 3 | 3 | 0.75 | — | 0.00 | 1.08 | 5.0 | 1 | 15 | 5 | 54 | 5 |
| | 4 | 1 | 0.50 | Ta | 0.10 | 1.00 | 10.0 | 1 | 25 | 100 | 50 | 100 |
| | 5 | 2 | 0.60 | V | 0.20 | 0.90 | 3.0 | 1 | 20 | 50 | 45 | 50 |
| | 6 | 3 | 0.80 | W | 0.15 | 1.02 | 8.0 | 1 | 28 | 60 | 51 | 60 |
| | 7 | 1 | 0.70 | Mo | 0.05 | 1.04 | 10.0 | 1 | 10 | 100 | 52 | 100 |
| | 8 | 2 | 0.80 | Cr | 0.20 | 1.10 | 2.0 | 1 | 20 | 90 | 55 | 90 |
| | 9 | 3 | 0.35 | — | 0.00 | 1.02 | 7.0 | 1 | 30 | 70 | 51 | 70 |

TABLE 5

| | | (CrAlM)N layer | | | | | Interfacial region | | | | |
|---|---|---|---|---|---|---|---|---|---|---|---|
| Type | | Tool substrate | Average Al content x (atomic ratio) | Type of M (—: none) | Average M content y (atomic ratio) | Average N content z (atomic ratio) | Average thickness (μm) | Tool substrate side | N content at tool substrate side (atomic %) | Tool surface side | N content at tool surface side (atomic %) | Average thickness (nm) |
| Example tool | 11 | 1 | 0.55 | Ce | 0.05 | 1.00 | 2.5 | 1 | 10 | 5 | 50 | 5 |
| | 12 | 2 | 0.70 | Si | 0.15 | 0.90 | 5.0 | 1 | 12 | 80 | 45 | 80 |
| | 13 | 3 | 0.35 | Ta | 0.20 | 0.96 | 0.5 | 1 | 15 | 40 | 48 | 40 |
| | 14 | 1 | 0.80 | Mo | 0.15 | 1.10 | 5.0 | 1 | 25 | 50 | 55 | 50 |
| | 15 | 2 | 0.65 | Y | 0.10 | 1.08 | 10.0 | 1 | 20 | 60 | 54 | 60 |
| | 16 | 3 | 0.75 | — | 0.00 | 0.94 | 7.0 | 1 | 28 | 100 | 47 | 100 |
| | 17 | 1 | 0.80 | V | 0.15 | 1.04 | 8.5 | 1 | 10 | 15 | 52 | 15 |
| | 18 | 2 | 0.30 | — | 0.00 | 1.00 | 0.5 | 1 | 20 | 30 | 50 | 30 |
| | 19 | 3 | 0.45 | — | 0.00 | 1.04 | 3.5 | 1 | 30 | 45 | 52 | 45 |

TABLE 6

| | | | | | | | | Interfacial region | | | |
|---|---|---|---|---|---|---|---|---|---|---|---|
| | | | | | | | | (TiAlM)N layer | | | |
| Type | | Tool substrate | Average Al content x (atomic ratio) | Type of M (—: none) | Average M content y (atomic ratio) | Average N content z (atomic ratio) | Average thickness (μm) | N content at tool substrate side (atomic %) | Tool surface side | N content at tool surface side (atomic %) | Average thickness (nm) |
| Comparative | 1 | 1 | 0.75 | — | 0.00 | 1.04 | 5.0 | — | — | — | — | 0 |
| Example | 2 | 2 | 0.50 | Ta | 0.10 | 1.02 | 3.0 | — | — | — | — | 0 |
| tool | 3 | 3 | 0.60 | V | 0.20 | 1.00 | 4.0 | — | — | — | — | 0 |

TABLE 7

| | | | | | | | | (CrAlM)N layer | | | |
|---|---|---|---|---|---|---|---|---|---|---|---|
| | | | | | | | | Interfacial region | | | |
| Type | | Tool substrate | Average Al content x (atomic ratio) | Type of M (—: none) | Average M content y (atomic ratio) | Average N content z (atomic ratio) | Average thickness (μm) | N content at tool substrate side (atomic %) | Tool surface side | N content at tool surface side (atomic %) | Average thickness (nm) |
| Comparative | 11 | 1 | 0.50 | Si | 0.10 | 1.08 | 5.0 | — | — | — | — | 0 |
| Example | 12 | 2 | 0.60 | — | 0.00 | 0.94 | 4.0 | — | — | — | — | 0 |
| tool | 13 | 3 | 0.45 | Ta | 0.15 | 1.04 | 3.0 | — | — | — | — | 0 |

Example tools 1 to 9 and 11 to 19 and Comparative Example tools 1 to 3 and 11 to 13 were subjected to high-rate cutting tests of alloy steel, cast iron, carbon steel, and stainless steel under the following conditions:
Cutting Test A: (Example Tools 1 to 9 and Comparative Example Tools 1 to 3)

Alloy steel samples were subjected to high-rate cutting tests under the conditions:
  Work material: round bar in accordance with JIS·SCM430 (HB250)
  Cutting rate: 220 m/min.
  Depth of cut: 0.3 mm
  Feed: 0.25 mm/rev.
  Cutting time: 5 minutes
(For reference, ordinary cutting rate is 165 m/min and ordinary feed is 0.20 mm/rev)
The results of the cutting test A are shown in Table 8.
Cutting Test B: (Example Tools 1 to 9, Comparative Example Tools 1 to 3)

Cast iron samples were subjected to high-rate cutting tests under the conditions:
  Work material: round bar in accordance with JIS·FCD600
  Cutting rate: 220 m/min.
  Depth of cut: 0.25 mm
  Feed: 0.21 mm/rev.
  Cutting time: 5 minutes
(For reference, ordinary cutting rate is 145 m/min and ordinary feed is 0.2 mm/rev)
The results of the cutting test B are shown in Table 9.
Cutting Test C: (Example Tools 11 to 19, Comparative Example Tools 11 to 13)

Carbon steel samples were subjected to continuous high-rate cutting tests under the conditions:
  Work material: round bar in accordance with JIS·S55C (HB250)
  Cutting rate: 220 m/min.
  Depth of cut: 0.2 mm
  Feed: 0.24 mm/rev.
  Cutting time: 5 minutes,
(For reference, ordinary cutting rate is 145 m/min and ordinary feed is 0.25 mm/rev)
The results of the cutting test C are shown in Table 10.
Cutting Test D: (Example Tools 11 to 19, Comparative Example Tools 11 to 13)

Stainless steel samples were subjected to continuous wet high-rate cutting tests under the conditions:
  Work material: round bar in accordance with JIS·SUS304 (HB180)
  Cutting rate: 140 m/min.
  Depth of cut: 2.0 mm
  Feed: 0.33 mm/rev.
  Cutting time: 9 minutes
(For reference, ordinary cutting rate is 120 m/min and ordinary feed is 0.3 mm/rev)
The results of the cutting test C are shown in Table 11.

TABLE 8

| | | Cutting test A | |
|---|---|---|---|
| Type | | Flank wear (mm) | Chipping |
| Example tool | 1 | 0.15 | Not found |
| | 2 | 0.18 | Not found |
| | 3 | 0.17 | Not found |
| | 4 | 0.15 | Not found |
| | 5 | 0.19 | Not found |
| | 6 | 0.18 | Not found |
| | 7 | 0.17 | Not found |
| | 8 | 0.17 | Not found |
| | 9 | 0.15 | Not found |
| Comparative example tool | 1 | *200 | Observed |
| | 2 | 1.1 | Not found |
| | 3 | 1.1 | Not found |

*indicates the cutting life (sec) before the maximum cutting length (cutting test time) due to damage.

TABLE 9

| Type | | Cutting test B | |
|---|---|---|---|
| | | Flank wear (mm) | Chipping |
| Example tool | 1 | 0.19 | Not found |
| | 2 | 0.20 | Not found |
| | 3 | 0.17 | Not found |
| | 4 | 0.21 | Not found |
| | 5 | 0.17 | Not found |
| | 6 | 0.18 | Not found |
| | 7 | 0.17 | Not found |
| | 8 | 0.15 | Not found |
| | 9 | 0.19 | Not found |
| Comparative example tool | 1 | *110 | Observed |
| | 2 | 0.9 | Not found |
| | 3 | 1.3 | Not found |

*indicates the cutting life (sec) before the maximum cutting length (cutting test time) due to damage.

TABLE 10

| Type | | Cutting test C | |
|---|---|---|---|
| | | Flank wear (mm) | Chipping |
| Example tool | 11 | 0.18 | Not found |
| | 12 | 0.15 | Not found |
| | 13 | 0.16 | Not found |
| | 14 | 0.20 | Not found |
| | 15 | 0.18 | Not found |
| | 16 | 0.19 | Not found |
| | 17 | 0.14 | Not found |
| | 18 | 0.16 | Not found |
| | 19 | 0.18 | Not found |
| Comparative example tool | 11 | 1.2 | Not found |
| | 12 | *120 | Observed |
| | 13 | 1.4 | Not found |

*indicates the cutting life (sec) before the maximum cutting length (cutting test time) due to damage.

TABLE 11

| Type | | Cutting test D | |
|---|---|---|---|
| | | Flank wear (mm) | Chipping |
| Example tool | 11 | 0.21 | Not found |
| | 12 | 0.21 | Not found |
| | 13 | 0.22 | Not found |
| | 14 | 0.19 | Not found |
| | 15 | 0.23 | Not found |
| | 16 | 0.22 | Not found |
| | 17 | 0.17 | Not found |
| | 18 | 0.24 | Not found |
| | 19 | 0.23 | Not found |
| Comparative example tool | 11 | 1.4 | Not found |
| | 12 | *110 | Observed |
| | 13 | 1.5 | Not found |

*indicates the cutting life (sec) before the maximum cutting length (cutting test time) due to damage.

The results in Tables 8 to 11 demonstrate that Example tools 1 to 9 have high chipping and wear resistance without chipping and abnormal damage in Cutting tests A and B and Example tools 11 to 19 also have high chipping and wear resistance without chipping and abnormal damage in Cutting tests C and D. In contrast, Comparative Example tools 1 to 3 have chipping or noticeable flank wear in Cutting tests A and B, and Comparative Example tools 11 to 13 also have chipping or noticeable flank wear in Cutting tests C and D, resulting in short service lives.

The embodiments are disclosed for illustrative purpose only, but not for limitation of the invention. The scope of the present invention should be determined by the description of Claims and includes a variety of equivalents and modifications of Claims.

REFERENCE NUMERALS

1: tool substrate
2: interfacial region
3: hard coat film (main region)
4: hard coat layer

The invention claimed is:

1. A surface-coated cutting tool comprising:
a tool substrate; and
a hard coat layer including a complex nitride layer on the tool substrate, the hard coat layer having an average thickness in the range of 0.5 to 10.0 µm, wherein
the complex nitride layer has a composition: $(Ti_{1-x-y}Al_xM_y)N_z$ where $0.35 \leq x \leq 0.80$, $0.00 \leq y \leq 0.20$, $0.20 \leq (1-x-y) \leq 0.65$, and $0.90 \leq z \leq 1.10$ (where x, y, and z represents atomic ratios, M is at least one element selected from the group consisting of Groups 4 to 6 elements, Y, Si, La, and Ce in the IUPAC periodic table),
the hard coat layer has an interfacial region extending from a point above a surface of the tool substrate toward a surface of the cutting tool and having a thickness in a range of 5 to 100 nm, and the N content ratio to the total of Ti, Al, M, and N contents is 10 to 30 atomic % at the point and increases toward the surface of the cutting tool, and
wherein the interfacial region has a thickness in a range of 50 to 100 nm.

2. A surface-coated cutting tool comprising:
a tool substrate; and
a hard coat layer including a complex nitride layer on the tool substrate, the hard coat layer having an average thickness in the range of 0.5 to 10.0 µm, wherein
the complex nitride layer has a composition: $(Cr_{1-x-y}Al_xM_y)N_z$ where $0.35 \leq x \leq 0.80$, $0.00 \leq y \leq 0.20$, $0.20 \leq (1-x-y) \leq 0.65$, and $0.90 \leq z \leq 1.10$ (where x, y, and z represents atomic ratios, M is at least one element selected from the group consisting of Groups 4 to 6 elements, Y, Si, La, and Ce in the IUPAC periodic table),
the hard coat layer has an interfacial region extending from a point above a surface of the tool substrate toward a surface of the cutting tool and having a thickness in a range of 5 to 100 nm, and the N content ratio to the total of Cr, Al, M, and N contents is 10 to 30 atomic % at the point and increases toward the surface of the cutting tool, and
wherein the interfacial region has a thickness in a range of 30 to 100 nm.

3. The surface-coated cutting tool according to claim 1, wherein the N content ratio to the total of Ti, Al, M, and N contents is 12 to 28 atomic % at the point and increases toward the surface of the cutting tool.

4. The surface-coated cutting tool according to claim 3, wherein the N content ratio to the total of Ti, Al, M, and N contents is 15 to 25 atomic % at the point and increases toward the surface of the cutting tool.

5. The surface-coated cutting tool according to claim 1, wherein the hard coat layer has an average thickness in the range of 2.0 to 10.0 µm.

6. The surface-coated cutting tool according to claim 1, wherein the hard coat layer has an average thickness in the range of 0.5 to 8.0 µm.

7. The surface-coated cutting tool according to claim 6, wherein the hard coat layer has an average thickness in the range of 3.0 to 8.0 μm.

8. The surface-coated cutting tool according to claim 1, wherein the interfacial region has a thickness in a range of 50 to 90 nm.

9. The surface-coated cutting tool according to claim 8, wherein the interfacial region has a thickness in a range of 60 to 90 nm.

10. The surface-coated cutting tool according to claim 9, wherein the interfacial region has a thickness in a range of 60 to 80 nm.

11. The surface-coated cutting tool according to claim 2, wherein the N content ratio to the total of Cr, Al, M, and N contents is 12 to 28 atomic % at the point and increases toward the surface of the cutting tool.

12. The surface-coated cutting tool according to claim 11, wherein the N content ratio to the total of Cr, Al, M, and N contents is 15 to 25 atomic % at the point and increases toward the surface of the cutting tool.

13. The surface-coated cutting tool according to claim 2, wherein the hard coat layer has an average thickness in the range of 2.5 to 10.0 μm.

14. The surface-coated cutting tool according to claim 2, wherein the hard coat layer has an average thickness in the range of 0.5 to 8.5 μm.

15. The surface-coated cutting tool according to claim 14, wherein the hard coat layer has an average thickness in the range of 3.5 to 8.5 μm.

16. The surface-coated cutting tool according to claim 2, wherein the interfacial region has a thickness in a range of 30 to 80 nm.

17. The surface-coated cutting tool according to claim 2, wherein the interfacial region has a thickness in a range of 40 to 100 nm.

18. The surface-coated cutting tool according to claim 17, wherein the interfacial region has a thickness in a range of 40 to 80 nm.

* * * * *